United States Patent [19]
Tokumo

[11]  4,258,329
[45]  Mar. 24, 1981

[54] NOISE SUPPRESSION SYSTEM
[75] Inventor: Akio Tokumo, Kawagoe, Japan
[73] Assignee: Pioneer Electronic Corporation, Tokyo, Japan
[21] Appl. No.: 22,388
[22] Filed: Mar. 21, 1979
[30] Foreign Application Priority Data
Mar. 22, 1978 [JP] Japan .............................. 53-36630[U]
[51] Int. Cl.³ ............................................ H03F 1/26
[52] U.S. Cl. ................................ 330/149; 330/124 R; 330/126; 330/258; 330/295
[58] Field of Search ...................... 330/69, 124 R, 126, 330/149, 258, 295; 179/1 A, 1 P

[56] References Cited
U.S. PATENT DOCUMENTS

| 3,448,398 | 6/1969 | Ball et al. | 330/69 |
| 4,024,346 | 5/1977 | McDermott | 330/258 X |
| 4,138,641 | 2/1979 | Karlin et al. | 330/258 X |
| 4,162,456 | 7/1979 | Lukes | 330/258 X |

OTHER PUBLICATIONS

Penfold, "Ambiphonic Adapter", *Radio & Electronics Constructor*, Apr. 1976, pp. 534-539.
"The Loud Mouth," *Elektor*, Oct. 1976, pp. 1048-1052.

*Primary Examiner*—James B. Mullins
*Attorney, Agent, or Firm*—Sughrue, Rothwell, Mion, Zinn and Macpeak

[57] ABSTRACT

A noise suppression device for automobile stereo components having a noist suppression circuit interposed between the output of the audio source and the input of the amplifier section. The suppression circuit has a differential amplifier or an operational amplifier to eliminate noise from the source. In a multi-amplifier system the noise suppression device is interposed between the pre-amplifier and the primary amplifiers.

7 Claims, 7 Drawing Figures

NOISE SUPPRESSION SYSTEM

BACKGROUND OF THE INVENTION

This invention relates to a noise suppression device for audio equipment, and more particularly to a noise suppression device provided between an audio source and an amplifier section or between a pre-amplifier and a main amplifier to eliminate a noise component in an automobile stereo set.

In the component car stereo, an audio source A, such as a cassette tape deck or an FM receiver, is coupled to an amplifier section B as shown in FIG. 1 by means of shielding wires. In the case where an impedance of the grounded wire $l'$ is not negligible, various noises emanating from automobiles, such as switching noises, ignition noises, horn noises or the like, will be applied to the grounded wire $l'$, thereby causing a noise current to flow therethrough. For this reason, the noise voltage $e_n$ equivalently coupled in series to the audio source output signal $e_i$ will be applied between the output terminal $E_{out}$ of the audio source A and the input terminal $E_{in}$ of the amplifier section B, it is then amplified by the amplifier section and emitted from a loud speaker (not shown in FIG. 1) coupled to the output of the amplifier section B. In addition, since a part of the power source current of the amplifier section A flows in the grounded path, the ripple voltage thereof will be superimposed on the signal flowing between the output $E_{out}$ of the audio source A and the input terminal $E_{in}$ of the amplifier section B. This creates unwanted distortion.

In order to eliminate the aforementioned of these problems it has been conventionally proposed to interpose a line transformer or photo-coupler between the output terminal of the audio source A and the input terminal of the amplifier section B or in a multi-amplifier system between the output of a pre-amplifier and the input of a main amplifier. However, the line transformer technique is disadvantageous in that it has a large physical configuration and is relatively heavy. Besides, it is expensive if the device having a good treble frequency characteristic is chosen. In the photo-coupler, because the linearity of electrical properties is inferior, it is disadvantageous in that fidelity is degraded. In addition, the photo-coupler is also expensive. In the multi-amplifier system, a number of the line transformers or the photo-couplers must be provided, the overall audio equipment will accordingly become expensive.

SUMMARY OF THE INVENTION

Accordingly, an object of the present invention is to provide a noise suppression device which eliminates the aforementioned drawbacks.

Briefly, and in accordance with the present invention, the noise suppression device in interposed between the output of the audio source and the input of the amplifier section. In the multi-amplifier system the same is interposed between the output of the pre-amplifier and the input of the main amplifier. The noise suppression device is essentially provided with a differential amplifier or an operational amplifier, which eliminates the noise signal emanating the source, typically from an automobile where the equipment is mounted. The features of the present invention will become more apparent when read with the following description in conjunction with the accompanying drawings.

DETAILED DESCRIPTION OF THE PREFERRED EMBODIMENTS

Figure 2:
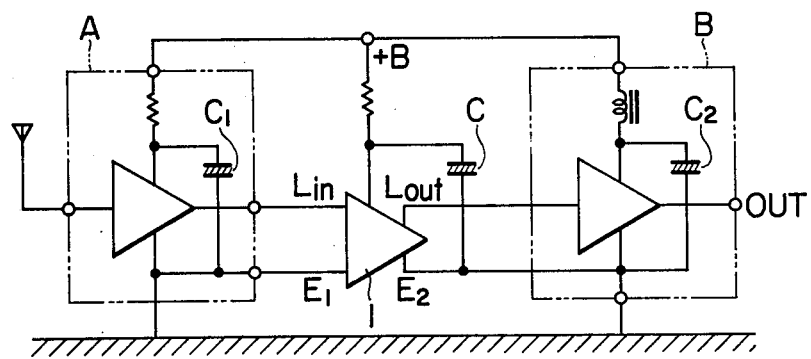
FIG. 2 is an explanatory diagram for explaining the use of the noise suppression device according to the present invention.
Figure 3:
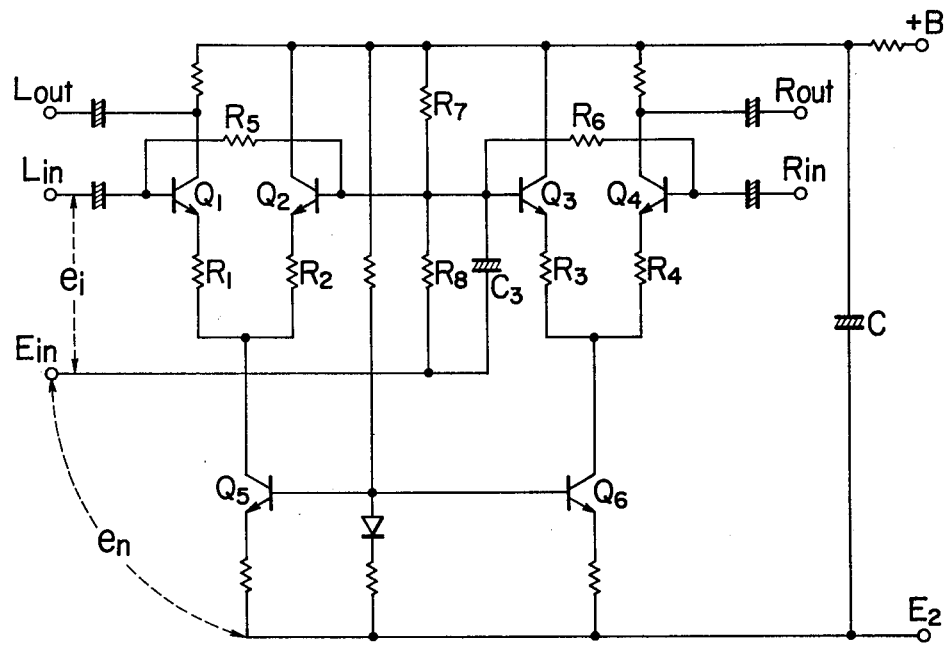
FIG. 3 is a circuit diagram showing the first embodiment according to the present invention.

A first embodiment according to the present invention will be described with reference to FIGS. 2 and 3. A noise suppression device according to this embodiment is interposed between an audio source A and an amplifier section B as shown in FIG. 2. The audio source A may be the cassette tape deck, FM receiver etc. as previously mentioned. The circuit diagram of the noise suppression device is depicted in FIG. 3, which basically comprises a pair of differential amplifiers. More specifically, the first differential amplifier for the left channel is made up of transistors $Q_1$ and $Q_2$ having emitters connected commonly through-load resistors $R_1$ and $R_2$, respectively, and a constant current source transistors $Q_5$ having a collector coupled to the commonly connected emitters of the transistors $Q_1$ and $Q_2$. The second differential amplifier for the right channel comprises transistors $Q_3$ and $Q_4$ having emitters connected commonly through load resistors $R_3$ and $R_4$, respectively, and a constant current source transistor $Q_6$ having a collector coupled to the commonly connected emitters of the transistors $Q_3$ and $Q_4$.

$R_5$ and $R_6$ are bias resistors for the first and second differential amplifiers, respectively, wherein the resistor $R_5$ is connected between the bases of the transistors $Q_1$ and $Q_2$ while the resistor $R_6$ is connected between the bases of the transistors $Q_3$ and $Q_4$. $R_7$ and $R_8$ are resistors for bias application to both of the differential amplifiers. $C_3$ is a coupling capacitor. $L_{in}$ and $L_{out}$ designate input and output terminals for the left channel, respectively. Likewise, $R_{in}$ and $R_{out}$ designate input and output terminals for the right channel. $E_{in}$ is a common input terminal to both left and right channels and $E_2$ is a common terminal for both the first and the second differential amplifiers. C is a smoothing capacitor, which is interposed between a positive power battery +B and the terminal $E_2$.

Figure 1:
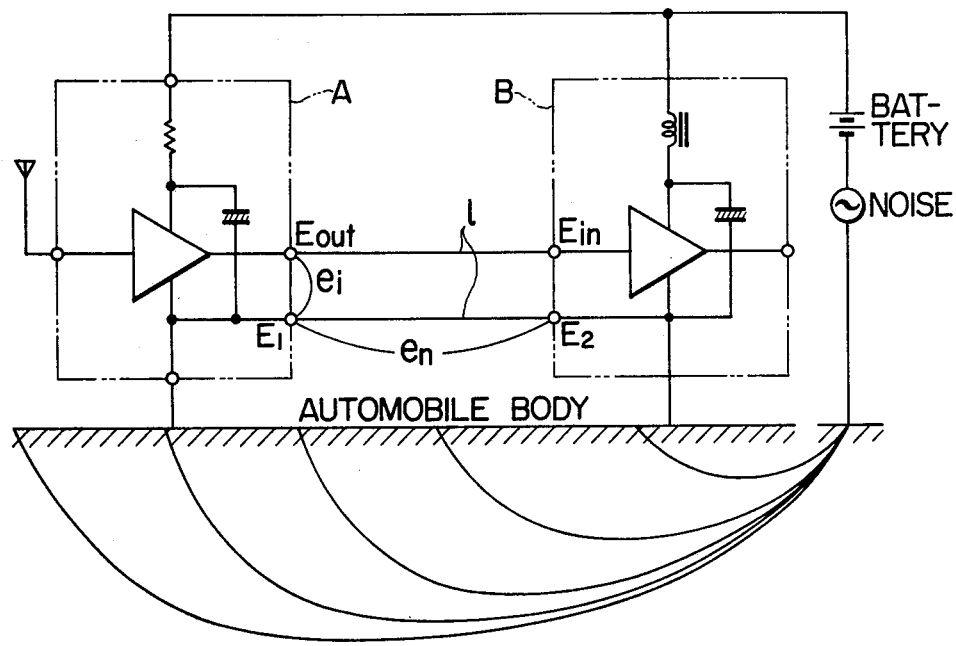
FIG. 1 is an explanatory circuit diagram showing the connecting condition of the audio source and the amplifier section.

Assuming that a noise voltage $e_n$ is induced between the terminals $E_1$ and $E_2$ as is mentioned in FIG. 1, the noise voltage $e_n$ will be directly applied to the common input terminal $E_{in}$ and the common terminal $E_2$ as indicated in FIG. 3. The noise voltage $e_n$ will be applied through the coupling capacitor $C_3$ to the bases of the transistors $Q_2$ and $Q_3$. Correspondingly, a signal corresponding to the audio source output $e_i$ on which the noise voltage $e_n$ is superimposed, i.e. $e_i + e_n$, is applied to the input terminals $L_{in}$ and $R_{in}$, whereby the signal corresponding to $e_i + e_n$ is applied to the bases of the transistors $Q_1$ and $Q_4$. Since the signals $e_n$ and $e_i + e_n$ are the same phase, a differential signal of the signals $e_i + e_n$ and $e_n$, i.e., $-K(e_i + e_n - e_n) = -Ke_i$, appears on the output terminals $L_{out}$ and $R_{out}$ of the differential amplifiers. The signal appearing thereon exactly corresponds to the audio signal output derived from the audio source A. Accordingly, the noise voltage $e_n$ is not contained in the signals obtained from the output terminal $L_{out}$, the common terminal $E_2$, the output terminal $R_{out}$ and the common terminal $E_2$. As a result, only the audio source signal $e_i$ is purely transmitted to the amplifier section B coupled in the manner as shown in FIG. 2. Therefore no noise is included in the sound emitted from loud speakers coupled to the outputs of the amplifier section B.

The system shown in FIG. 3 is for a stereophonic reproduction, however, it can also be used for a monophonic reproduction by employing either of the left or the right channel circuit.

As described, since the first embodiment according to the present invention employs at least one differential amplifier in order to suppress the noise emanating from automobile ignitions or the like, only the audio source signal can be transmitted to the amplifier section regardless of the impedance between the audio source and the amplifier section.

The noise suppression device in accordance with this embodiment has excellent electrical properties in comparison with devices employing a transformer or a photo-coupler. Further, since it can be formed on an IC chip, it can be mass-produced at low cost. Furthermore, it is small in size and light in weight in comparison with the transformer and is accordingly convenient for mounting on the automobile such as dashboard locations.

Figure 4:
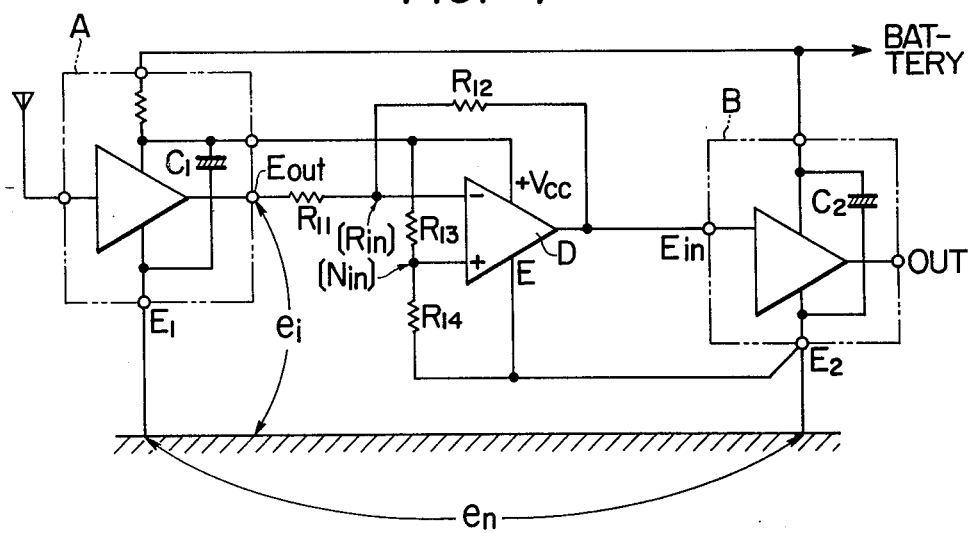
FIG. 4 is a circuit diagram showing the second embodiment according to the present invention.

The second embodiment according to the present invention will next be described with reference to FIG. 4, in which like symbols refer to the like sections or like parts as those shown in FIGS. 1 to 3. Reference symbol D designates an operational amplifier interposed between the audio source A and the amplifier section B. The operational amplifier D has an inverted input terminal [Rin] and a non-inverted input terminal [Nin]. The audio source output $E_{out}$ is applied through a resistor $R_{11}$ to the inverted input [Rin] and the output of the operational amplifier D is fed back to the inverted input [Rin] through a resistor $R_{12}$. A power source terminal $V_{cc}$ provided in the operational amplifier D is coupled to the non-inverted terminal [Nin] through a resistor $R_{13}$ and the non-inverted terminal [Nin] is coupled to the grounded point $E_2$ of the amplifier section B through a resistor $R_{14}$. Battery voltage $V_{cc}$ provided in the operational amplifier D, is supplied from the battery of the audio source A.

In the above construction, if noise voltage is induced between the grounded point $E_1$ at the side of the audio source A and the grounded point $E_2$ at the side of the amplifier section B, the applied voltage to the inverted input [Rin] will become $e_i + e_n$, considering the grounded point $E_2$ as a reference. In this situation, a gain $G_R$ of the operational amplifier viewed from the side of the inverted input terminal [Rin] will be $R_{12}/R_{11}$ in the case where the audio source impedance is sufficiently small. Therefore, the output $e_{oR}$ of the operational amplifier will become:

$$e_{oR} = -(e_i + e_n) \frac{R_{12}}{R_{11}} \quad (1)$$

where $-e_n \cdot R_{12}/R_{11}$ is the noise component. Conversely, a gain $G_N$ of the operational amplifier D viewed from the side of the non-inverted input terminal [Nin] will be $(R_{11} + R_{12})/R_{11}$ and because the noise voltage $e_n$ is divided by the resistors $R_{13}$ and $R_{14}$, the output $e_{oN}$ of the operational amplifier in this case will become:

$$e_{oN} = e_n \cdot \frac{R_{11} + R_{12}}{R_{11}} \cdot \frac{R_{14}}{R_{13} + R_{14}} \quad (2)$$

Here, the condition for not containing the noise component $e_n$ in the output of the operational amplifier is the case where the noise component $-e_n \cdot R_{12}/R_{11}$ in the output $e_{oR}$ from the inverted input [Rin] and the output from the non-inverted input [Nin] as indicated in equation (2) are equal to each other. That is, $$-e_n \cdot \frac{R_{12}}{R_{11}} = e_n \cdot \frac{R_{11} + R_{12}}{R_{11}} \cdot \frac{R_{14}}{R_{13} + R_{14}} \quad (3)$$

Thus, following relationship can be obtained:

$$R_{12}/R_{11} = R_{14}/R_{13} \quad (4)$$

Accordingly, insofar as the resistance ratio of the resistors $R_{11}$ to $R_{14}$ given by equation (4) is satisfied, the noise component can be totally eliminated whatever the gain of the amplifier and the ground impedance may be. Thus, only the audio source output signal can be delivered to the amplifier section B.

Figure 5:
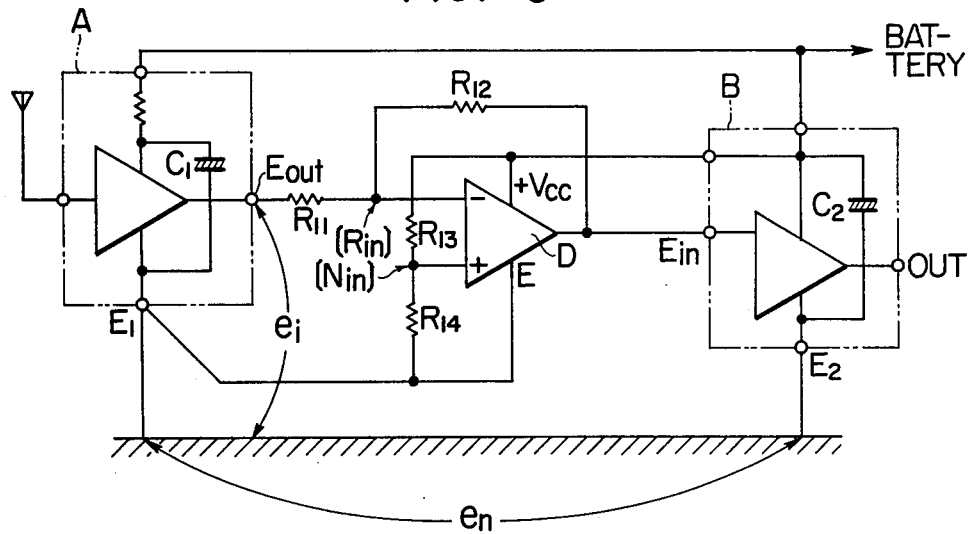
FIG. 5 is a circuit diagram showing the third embodiment according to the present invention.

The third embodiment according to the present invention will be described with reference to FIG. 5, in which like symbols refer to like sections or like parts as those shown in FIG. 4. This embodiment is as a whole similar to the second embodiment in that it employs an operational amplifier. The description of the connecting relation or the connected elements common to FIG. 3 will be omitted herein to avoid repetition.

The power source $V_{cc}$ provided in the operational amplifier D is supplied from the power source of the amplifier section B. The terminal of the resistor $R_{14}$ at the grounded side is connected to the grounded point $E_1$ of the audio source A. In this case, the output $e_{oN}$ of the operational amplifier D derived from the non-inverted input [Nin] will become:

$$e_{oN} = e_n \cdot \frac{R_{11} + R_{12}}{R_{11}} \cdot \frac{R_{13}}{R_{13} + R_{14}} \quad (5)$$

Accordingly, the condition for not containing the noise component $e_n$ in the output of the operational amplifier is determined by equations (1) and (5). That is, $$R_{12}/R_{11} = R_{13}/R_{14} \quad (6)$$

As described, in this embodiment, insofar as the resistance ratio of the resistors $R_{11}$ to $R_{14}$ connected to the operational amplifier satisfies equation (6), only the audio source signal will be transmitted to the amplifier section B regardless of the noise component. Furthermore, because no elements which cause distortion are interposed in the transmission lines between the audio source and the amplifier section, additional distortion will not be produced, other than the primary distortion caused by the audio source, amplifier etc.

The noise suppression systems in accordance with the second and the third embodiment also have excellent electrical properties in comparison with the devices employing a transformer or the photo-coupler. Additionaly, since they can be formed in IC chips, they can be mass-produced at low cost. Furthermore, they are small in size and light in weight in comparison with the transformer, and as the case with the preceding embodiments can conveniently be mounted in automobiles.

A fourth embodiment will be described with reference to FIGS. 6 and 7. This embodiment is directed to a noise suppression device for use in a multi-amplifier system mounted in the automobile. In the multi-amplifier system where at least two main amplifiers are operated in accordance with the output of a single pre-amplifier, the grounded input terminals of the respective main amplifiers are commonly connected in the preceding pre-amplifier, thereby forming a ground loop. Due to the ground loop, a noise component superimposed on the power supply lines is applied to the inputs of the main amplifiers. As a result, the noise component is augmented by the main amplifiers, thereby irritating listeners.

The above-described condition will be explained more in detail referring to FIG. 6. FIG. 6 shows a multi-amplifier system, in which an output signal $e_i$ of the pre-amplifier A is applied to input terminals $I_1$ and $I_2$ of two main amplifiers $B_1$ and $B_2$, respectively. Loud speakers $SP_1$ and $SP_2$ are coupled to the output terminals $O_1$ and $O_2$ of the main amplifiers $B_1$ and $B_2$, respectively. Suppose that the distance between the pre-amplifier A and the main amplifier $B_2$ is substantial: an impedance between grounded terminals $E_A$ and $E_2$ will not be negligible. Accordingly, a noise current emanating from automobiles will flow in the grounded path therebetween. Therefore, the noise signal equivalently coupled in series to the output signal $e_i$ of the pre-amplifier A is to be applied to the input terminal $I_2$ the main amplifier $B_2$, which will then be amplified by the main amplifier $B_2$ and emitted from the loud speaker $SP_2$ as noise. In addition, since a part of the power source current of the main amplifier flows in the grounded path, the ripple voltage thereof will be superimposed on the signal flowing between the output terminal $O_A$ of the pre-amplifier A and the input terminal $I_2$ of the main amplifier $B_2$, thereby yielding unwanted distortion.

Figure 7:
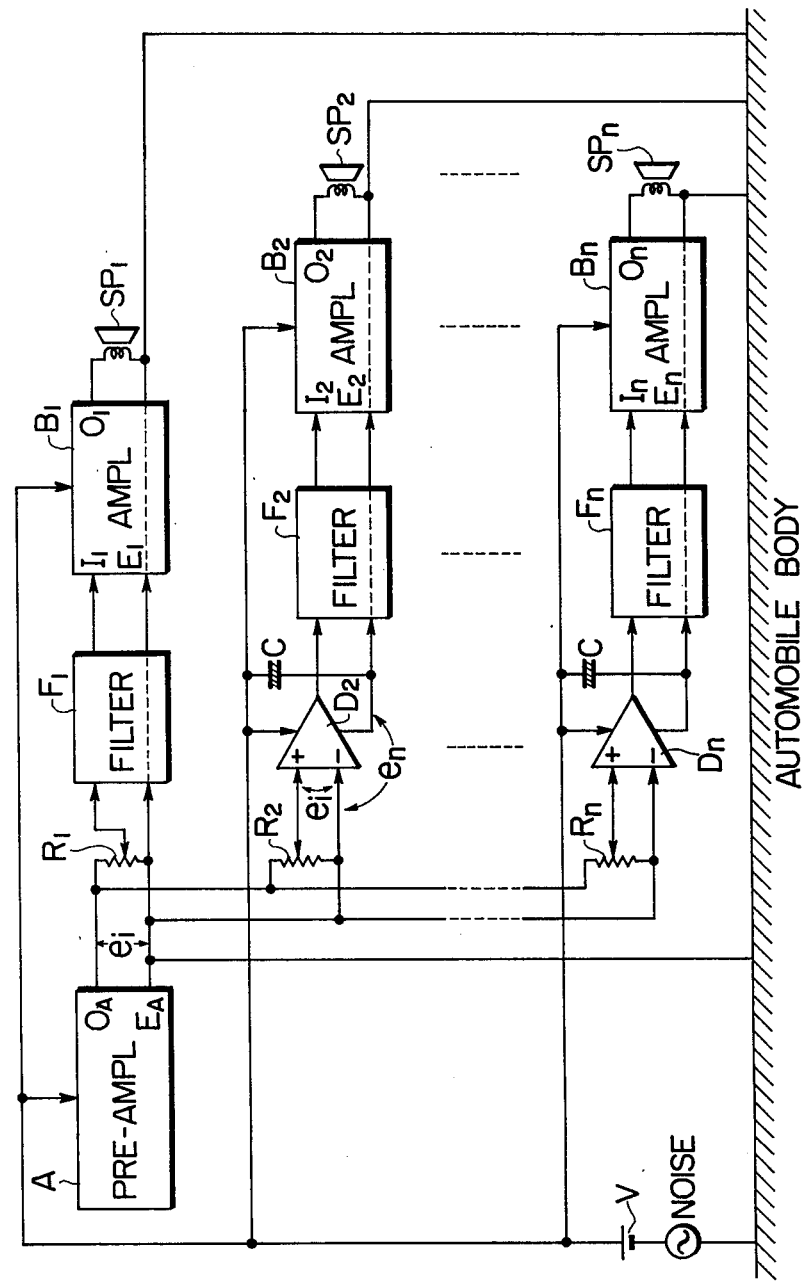
FIG. 7 is a circuit diagram showing the fourth embodiment according to the present invention in the case of the multi-amplifier system.

Referring to FIG. 7, an output signal $e_i$ at the output terminal $O_A$ of the pre-amplifier A is applied through a variable resistor $R_1$ for fade control and a bandpass filter $F_1$ used as a channel divider to the input terminal $I_1$ of the main amplifier $B_1$ having a loud speaker $SP_1$ at its output. It is now assumed that the distance between the main amplifier $B_1$ and the pre-amplifier A is small relative to the distances between the main amplifiers $B_2$ to $B_n$ and the pre-amplifier A and that the impedance between the grounded terminals $E_A$ and $E_1$ is negligible.

The output terminal $O_A$ of the pre-amplifier A is coupled to the non-inverted input terminals of the differential amplifiers $D_2$ to $D_n$ through fade controlling variable resistors $R_2$ to $R_n$, respectively. The grounded terminal $E_A$ of the pre-amplifier is, on the other hand, connected to inverted input terminals of the respective differential amplifiers $D_2$ to $D_n$. The outputs of the differential amplifiers $D_2$ to $D_n$ are coupled to the input terminals $I_2$ to $I_n$ of the respective main amplifiers $B_2$ to $B_n$ through the bandpass filters $F_2$ to $F_n$. The bandpass filters $F_2$ to $F_n$ having different passing band ranges are employed for channel dividing. The grounded terminals $E_2$ to $E_n$ of the main amplifiers are coupled through filters $F_2$ to $F_n$ to the grounded terminals of the differential amplifiers $D_2$ to $D_n$, respectively. Reference symbol C denotes smoothing capacitors and V denotes a car battery.

Figure 6:
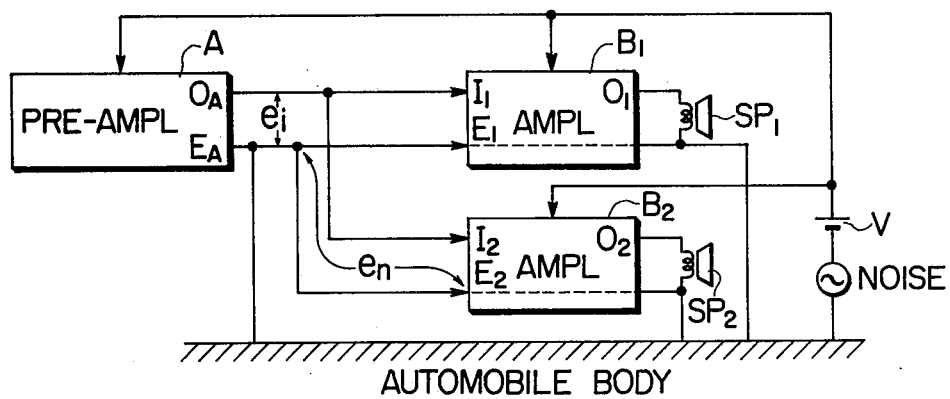
FIG. 6 is an explanatory circuit diagram showing the multi-amplifier system.

Assuming that noise voltage $e_n$ is now induced between the terminals $E_A$ and $E_2$ is shown in FIG. 6, it will be appreciated that in FIG. 7 the noise voltage $e_n$ is directly applied between the non-inverted input terminal of the differential amplifier $D_2$ and the grounded terminal thereof (common terminal). On the other hand, at the non-inverted terminal thereof, the signal having a voltage $e_i$ on which the noise voltage $e_n$ is superimposed, i.e., $e_i' + e_n$, is applied. The voltage $e_i'$ is such that the output signal voltage $e_i$ of the pre-amplifier is subjected to fade controlling. In this situation, since both signals $e_n$ and $e_i' + e_n$ are the same phase, a signal results equal to $K \cdot e_i' [= K \cdot (e_i' + e_n - e_n)]$ at the output of the differential amplifier $D_2$. I is an amplifying degree of the differential amplifier $D_2$. Accordingly, the noise voltage $e_n$ is totally eliminated by the provision of the differential amplifier $D_2$. This is equally true for the other differential amplifiers $D_3$ to $D_n$. Therefore, only the signal in accordance with the output signal $e_i$ of the pre-amplifier A is purely transmitted to the main amplifiers $B_2$ to $B_n$. Hence noise is not produced in the associated loud speakers $SP_2$ to $SP_n$.

In the above embodiment, the output of the pre-amplifier is adjusted via fade controlling resistors; however, it is possible to omit such resistors if necessary.

The noise suppression device according to this embodiment can also be formed in IC chip and therefore it can be mass-produced in low cost. In addition, the device can be very compact.

What is claimed is:

1. A noise suppression device for automobile audio equipment comprising, a differential amplifier coupled between an audio source and an amplifier for amplifing a signal derived from said audio source, said audio source and said amplifier each grounded to the automobile by grounded terminals, said differential amplifier having a first input terminal coupled to a grounded terminal of said audio source, a second input terminal coupled to an output terminal of said audio source and a common terminal common to said amplifier, to apply the signal introduced between an output terminal and the common terminal of said differential amplifier to said amplifier.

2. A noise suppression device for automobile audio equipment comprising, an operational amplifier coupled between an audio source and an amplifier for amplifying a signal derived from said audio source, said audio source and said amplifier each grounded to the automobile by grounded terminals, said operational amplifier having an inverted input terminal coupled through a first resistor element $R_1$ to an output of said audio source, an output terminal being fed back through a second resistor element $R_2$ to said inverted input terminal, a power source terminal to which a power source of said audio source is supplied, a non-inverted terminal and a grounded terminal, wherein a third resistor element $R_3$ and a fourth resistor element $R_4$ are connected in series between said power source terminal and said grounded terminal of said operational amplifier and a juncture point of said third and said fourth resistor elements is connected to said non-inverted terminal and wherein said resistor elements $R_1$ to $R_4$ satisfy a relationship of $R_2/R_1 = R_4/R_3$.

3. A noise suppression device for automobile audio equipment comprising, an operational amplifier coupled between an audio source and an amplifier for amplifying a signal derived from said audio source, said audio source and said amplifier each grounded to the automobile by grounded terminals, said operational amplifier having an inverted input terminal coupled through a first resistor element $R_1$ to an output of said audio source, an output terminal being fed back through a second resistor element $R_2$ to said inverted input terminal, a power source terminal to which a power source of said amplifer is supplied, a non-inverted terminal and a grounded terminal, wherein a third resistor element $R_3$ and a fourth resistor element $R_4$ are connected in series between said power source terminal and said grounded terminal of said operational amplifier and a juncture point of said third and said fourth resistor elements is connected to said non-inverted terminal and wherein said resistor elements $R_1$ to $R_4$ satisfy a relationship of $R_2/R_1 = R_3/R_4$.

4. A noise suppression device for multi-amplifier system automobile audio equipment including at least one pre-amplifier and a plurality of main amplifiers, said pre-amplifier and main amplifiers each grounded to the automobile by grounded terminals, comprising; differential amplifier means, said differential amplifier means comprising a number of differential sections, the number being one less than the number of said main amplifiers and which being respectively coupled between an output of said pre-amplifier and inputs of said main amplifier except one main amplifier, wherein the output of said pre-amplifier is applied to first inputs of said differential sections and a grounded terminal of said pre-amplifier is connected to second inputs of said differential sections so that outputs of the respective differential sections are applied to inputs of the associated main amplifiers.

5. The noise suppression device as claimed in claim 4, wherein a distance between said pre-amplifier and the main amplifier to which said differential amplifier is not coupled is relatively shorter than distances between said pre-amplifier and the remaining main amplifiers to which said differential sections are coupled respectively.

6. The noise suppression device as claimed in claim 4 or 5 further comprising the plurality of bandpass filters having a different passing band ranges one another, said bandpass filters being connected between the output of said pre-amplifier and the inputs of said main amplifiers respectively.

7. The noise suppression device as claimed in claim 4 or 5 further comprising the plurality of variable resistor elements respectively coupled between the output of said pre-amplifier and the inputs of said main amplifiers.

* * * * *